(12) United States Patent
Keller

(10) Patent No.: US 6,722,376 B2
(45) Date of Patent: Apr. 20, 2004

(54) POLYSILICON ETCH USEFUL DURING THE MANUFACTURE OF A SEMICONDUCTOR DEVICE

(75) Inventor: David J. Keller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/458,875

(22) Filed: Dec. 10, 1999

(65) Prior Publication Data

US 2003/0019831 A1 Jan. 30, 2003

(51) Int. Cl.$^7$ ............................................. H01I 21/302
(52) U.S. Cl. .................... 134/1.2; 438/725; 438/719; 438/714; 438/734
(58) Field of Search ................. 438/725, 719, 438/714, 734; 134/1.2

(56) References Cited

U.S. PATENT DOCUMENTS

| | | | | |
|---|---|---|---|---|
| 4,818,334 A | * | 4/1989 | Shwartzman et al. ....... 156/643 |
| 5,030,590 A | * | 7/1991 | Amini et al. ................ 437/233 |
| 5,147,499 A | * | 9/1992 | Szwejkowski et al. ...... 156/643 |
| 5,228,950 A | * | 7/1993 | Webb et al. ................ 156/643 |
| 5,792,708 A | * | 8/1998 | Zhou .......................... 438/647 |
| 5,976,769 A | * | 11/1999 | Chapman .................... 430/316 |
| 6,001,688 A | * | 12/1999 | Rizzuto ....................... 438/264 |

* cited by examiner

Primary Examiner—George A. Goudreau
(74) Attorney, Agent, or Firm—Kevin D. Martin

(57) ABSTRACT

A method for etching a polysilicon layer comprises the steps of providing a semiconductor wafer substrate assembly having at least first and second features therein in spaced relation to each other which define an opening therebetween. A blanket polysilicon is formed over the wafer assembly and within the opening. A patterned photoresist layer is formed over the polysilicon layer, then the polysilicon layer within the opening is etched with a first etch. Subsequent to said first etch, the polysilicon with the opening is etched with a second etch comprising a halogen-containing gas flow rate of from about 35 sccm to about 65 sccm and an oxygen-containing gas (for example $HeO_2$) flow rate of from about 12 sccm to about 15.6 sccm.

8 Claims, 3 Drawing Sheets

POLYSILICON ETCH USEFUL DURING THE MANUFACTURE OF A SEMICONDUCTOR DEVICE

FIELD OF THE INVENTION

This invention relates to the field of semiconductor assembly, and more specifically to a polysilicon etch which is particularly useful for removing polysilicon stringers.

BACKGROUND OF THE INVENTION

During the manufacture of semiconductor devices such as dynamic random access memories (DRAMs), static random access memories (SRAMs), microprocessors, logic, etc., several structures are commonly formed. With reference to FIG. 1, a semiconductor wafer substrate assembly 10 is provided. The wafer assembly typically comprises a semiconductor wafer 12 having a transistor stack 14 formed thereon. With current technology, for example a 64 megabit DRAM manufactured with 0.18-micron line widths, each wafer stack comprises gate oxide 16 about 60 angstroms (Å) thick, a polysilicon control gate (word line) 18 about 800 Å thick, a silicide layer 20 about 1,000 Å thick, a nitride cap 22 about 2,000 Å thick, and a pair of oxide spacers 24. The spacing between each stack (between adjacent spacers) is about 1,300 Å. Such a structure is easily manufactured by one of ordinary skill in the art.

FIG. 1 further depicts a doped blanket polysilicon layer 26, for example about 3,500 Å thick which is provided to form a landing pad for a contact. A patterned photoresist mask 28 is formed over the polysilicon layer 26 and an anisotropic polysilicon etch is performed to define the landing pad. To etch the polysilicon layer depicted, a conventional etch comprises 90 standard cubic centimeters (sccm) $Cl_2$ and 10 sccm $NF_3$ at a pressure of 300 millitorr (mTorr) and 100 watts power to clear the majority of the exposed polysilicon, then the pressure is increased and $SF_6$ is added toward the end of the etch in an attempt to clear any residual material from the exposed regions.

A desired resulting structure is depicted in FIG. 2 which depicts a clean removal of the exposed polysilicon and no undercutting of the resist. However, with severe topology having narrow spaces between the relatively high transistor gate stacks, a more common result is depicted in FIG. 3. Stringers 30 can form in the recesses as it is difficult to clear all the polysilicon from narrow, deep spaces found with high-density semiconductor devices, even with the increase in pressure and addition of $SF_6$ in the conventional etch described above. Stringers, which form especially in corners, are well known in the art to cause shorting and result in malfunctioning semiconductor devices.

Another method used in an attempt to reduce stringers includes performing a series of alternating anisotropic and isotropic etches, with the anisotropic etches removing the polysilicon in a substantially vertical direction and the isotropic etches removing the polysilicon in both horizontal and vertical directions. One problem with this method is that the isotropic etches undercut the photoresist 28 and narrow the width of the polysilicon feature 26. Thus the critical dimension (CD) of the polysilicon feature is wider than would be required if the photoresist was not undercut, and thus the alignment tolerance is reduced. For example, with a device using 0.18 micron line widths a typical undercut is about 0.03 microns on each side (0.06 microns total). Thus the feature must be patterned for a 30% undercut tolerance. The additional space required for this allowance is a concern especially as the number of features on the device increases.

As device generations progress, the spaces between transistor stacks will decrease thereby exacerbating the problem of remaining stringers. A method which removes polysilicon, and particularly which removes stringers from severe topology, would be desirable.

SUMMARY OF THE INVENTION

The present invention provides a new method which reduces problems associated with the manufacture of semiconductor devices, particularly problems associated with etching polysilicon in narrow, deep openings associated with severe topology. In accordance with one embodiment of the invention, a semiconductor wafer substrate assembly is provided having adjacent structures which form an opening such as a trench or recess. A layer of polysilicon is formed over the wafer substrate assembly and within the opening, and a patterned photoresist layer is formed over the blanket polysilicon. An etch is performed using one of several embodiments of an inventive etch described in detail below. The inventive etch improves removal of the polysilicon from the opening and reduces the likelihood of stringers remaining after the etch.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

An embodiment of the instant invention comprises an etch suitable for etching polysilicon and which is particularly useful for removing polysilicon from deep, narrow openings with minimal removal of oxides and nitrides.

A first inventive etch embodiment comprises the combination of a halogen-containing gas, for example Br, HBr, $CF_4$, $NF_3$, $Cl_2$, or HCl, and an oxygen-containing gas, for example $O_2$ or $HeO_2$ in an etcher which is top and bottom powered or modified to be top and bottom powered. Various other similar gasses may function sufficiently, and suitable high-density etchers include an Applied Materials DPS or HDP, a LAM model 9400 or TCP, or other such etchers.

Various etcher settings and gas flow rates provide different results which can be optimized for specific processes.

Figure 1:
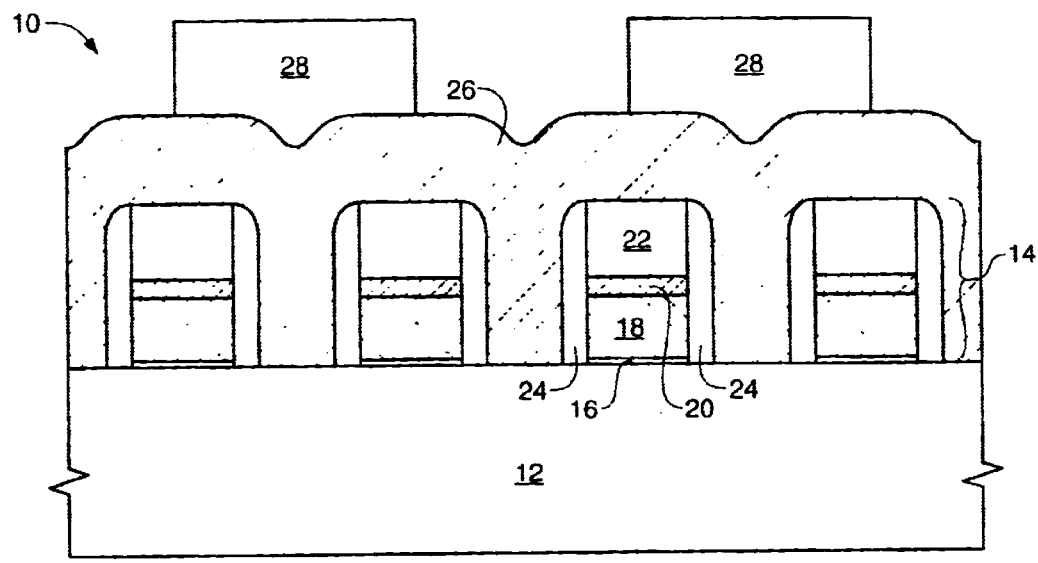
FIG. 1 is a cross section depicting a wafer substrate assembly having a polysilicon layer and a photoresist layer formed thereover.
Figure 2:
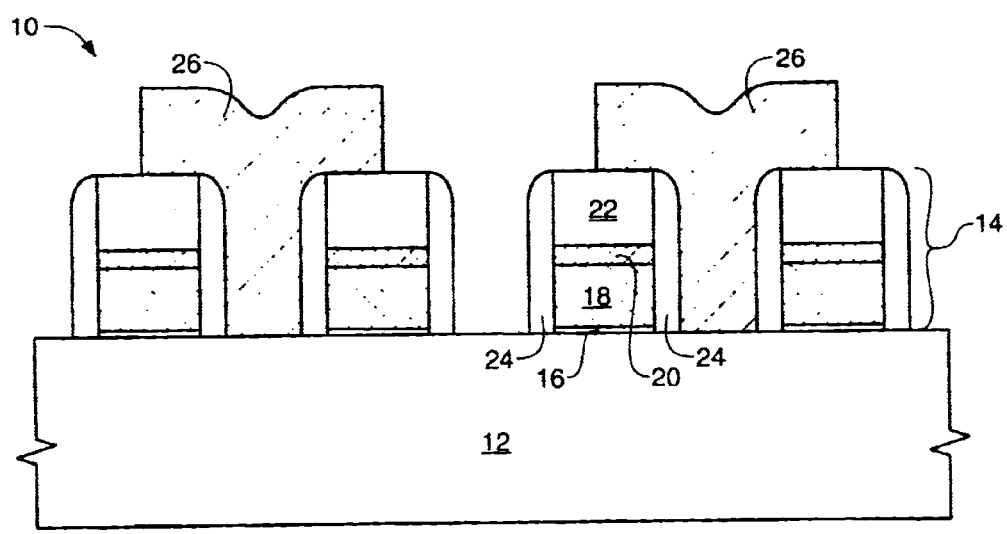
FIG. 2 is a cross section depicting the FIG. 1 structure after a polysilicon etch with desirable results.
Figure 3:
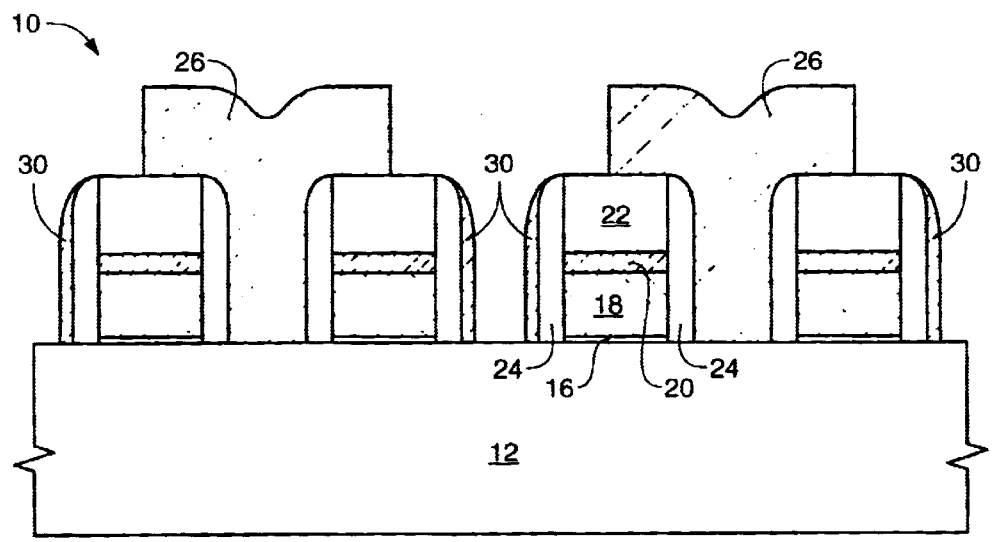
FIG. 3 is a cross section depicting the FIG. 1 structure after a polysilicon etch after which polysilicon stringers remain.

The settings discussed below provide settings optimized for a process to etch the polysilicon 26 of FIG. 1 to result in a structure similar to FIG. 2, having reduced (or eliminated) stringers when compared with conventional etches. Other applicable parameters relative to FIG. 1 for this embodiment include a gate stack 14 height (from the top surface of wafer 12 to top of nitride 22) of between about 2,500 Å and about 3,000 Å, a polysilicon layer 26 thickness of between about 3,500 Å and about 4,000 Å, and a distance between adjacent spacers of about 1,300 Å.

To etch the polysilicon layer, a pressure of between about 42 mTorr and about 78 mTorr, an upper (TCP) power of from about 245 watts to about 455 watts, and a lower (bias) power of from about 49 watts to about 91 watts would provide sufficient etch results. More preferably, the pressure will be in the range of about 54 mTorr to about 66 mTorr, the top power will be in the range of about 315 watts to about 345 watts, and the lower power will be in the range of about 63 watts to about 77 watts. Most preferably, the pressure will be about 60 mTorr, the upper power will be about 350 watts, and the lower power will be about 70 watts. Generally, a lower pressure will provide a more vertical anisotropic etch (more etching of the horizontal bottom of the opening) and a higher pressure will provide a more isotropic etch. Also, as the top power increases the etch will become more isotropic and as bottom power increases the etch will become more anisotropic.

The flow rate of the halogen-containing gas is preferably in the range of about 35 standard cubic centimeters (sccm) to about 65 sccm, more preferably in the range of about 45 sccm to about 55 sccm, and most preferably about 50 sccm. The oxygen flow rate of the oxygen-containing gas is preferably in the range of about 1.9 sccm to about 4.7 sccm, more preferably between about 2.4 sccm and about 4.0 sccm, and most preferably between about 2.7 sccm and about 3.6 sccm. The total flow rate of the oxygen-containing gas can easily be determined by one of ordinary skill in the art. As an example, using $HeO_2$ as the oxygen-containing gas, the total flow rate of the $HeO_2$ (helium and oxygen components) is preferably in the range of about 6.3 sccm to about 15.6 sccm, more preferably between about 8.1 sccm and about 13.2 sccm, and most preferably between about 9 sccm and about 12 sccm, as the $HeO_2$ gas comprises 30% oxygen and 70% helium. Using the preferred settings described above, the polysilicon will be etched at a rate of between about 1,000 Å/min and about 2,000 Å/min.

Figure 4:
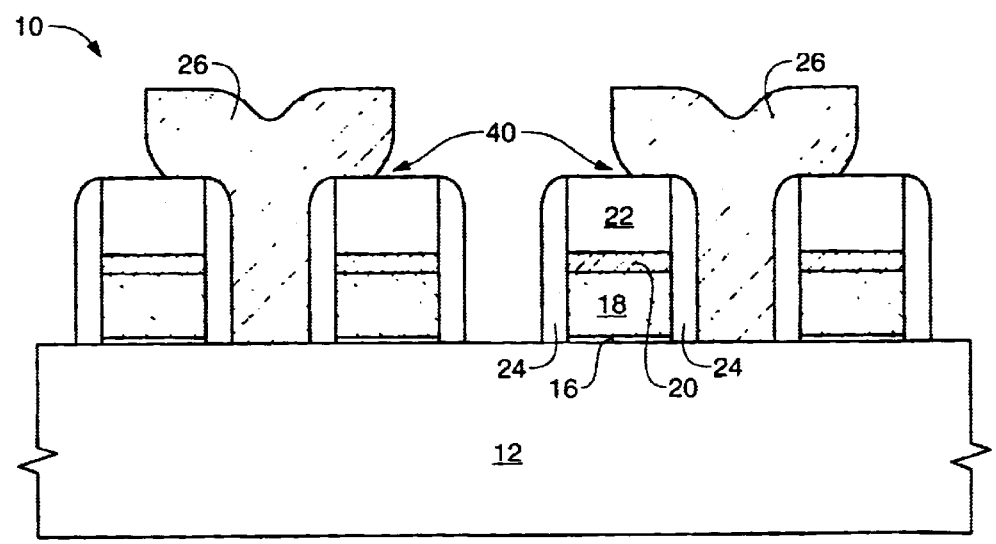
FIG. 4 is a cross section depicting generally benign etching of the polysilicon feature with one embodiment of the inventive etch.

The amount of polysilicon etched toward the bottom of the opening varies proportionally with the amount (flow rate) of oxygen-containing gas. Thus if relatively little oxygen-containing gas is introduced into the etch chamber, the polysilicon is etched at about the same rate along the entire height of the feature thereby providing a substantially vertical anisotropic etch. With increasing proportions of oxygen-containing gas the etch becomes more isotropic and etches an increasing percentage of polysilicon from the bottom of the feature. FIG. 2 depicts a structure resulting from an etch of the FIG. 1 device with an inventive etch having a flow rate of oxygen-containing gas in the lower ranges of those specified above. In especially narrow regions, this etch may leave polysilicon in the corners of the features, for example between the bottom of oxide spacer 24 and the bottom of the opening defined by the top of the wafer which form a 90° angle in FIG. 2. Increasing the proportion of oxygen-containing gas will more effectively remove the polysilicon from the narrow regions. However, especially high proportions of oxygen-containing gas, especially in combination with top power in the higher range, may result in the structure of FIG. 4 wherein the polysilicon feature 26 being etched is undercut 40. As this etch is particularly selective to oxide and nitride, such an undercut is relatively benign. The feature 26 is not narrowed and the critical dimension does not need to be altered. Further, the polysilicon which is removed to leave undercut 40 will be filled in by a dielectric provided during subsequent processing. With increased doping of the polysilicon, the etch will result in additional undercut.

In another embodiment of the invention, the oxygen flow rate of the oxygen-containing gas can remain low (for example, from about 1.9 sccm to about 2.7 sccm) during the first part of the etch then increased (for example, from about 3.6 sccm to about 4.7 sccm) toward the end of the etch. Further, the top power can remain in the lower ranges (for example, from about 245 to about 315 watts) during the first part of the etch, then increased (for example, from about 385 to about 455 watts) toward the end of the etch. This embodiment would allow for stringer removal with minimal undercutting and therefore minimal removal of the polysilicon feature being formed.

With the various embodiments described above a polymer can form as the etch progresses. Polymers are well known in the art to form especially on vertical surfaces during etching. In another embodiment of the invention, the etch further comprises the use of helium at a flow rate of between about 70 sccm and 130 sccm, preferably between about 90 sccm and 110 sccm, and most preferably about 100 sccm, introduced into the etch chamber with the halogen-containing gas and the oxygen-containing gas. Adding helium reduces the build-up of polymer in the center of the wafer and prevents the etch from shutting down in the center of the wafer.

The etch is believed to remove more material at the bottom of a polysilicon feature (at a location proximal to the semiconductor wafer) than at the top (at a location distal to the wafer) under certain conditions described above as a result of "charging" which causes the ions to bend into the stringers. This is in contrast to conventional stringer etches which use high pressures to scatter the ions into the stringers resulting from collisions between ions. These conventional etches are somewhat uncontrollable as they use high energy ions to "erode" the undesirable material, which also erodes the desirable material the ions contact. The inventive etch is highly selective to oxide and thereby provides good polysilicon removal with little oxide or nitride removal, even during an extended over-etch. It is estimated that a poly:oxide etch rate of between about 50:1 and about 150:1 can be achieved with the various embodiments of the invention as described above. Increasing the flow rate of the oxygen-containing gas (specifically the oxygen component) increases the undercut (or "nip") of the polysilicon and also increases the selectivity to oxide and nitride. Thus an etch with a higher oxygen flow rate etches a lower portion of the feature at a faster isotropic rate than it etches an upper portion.

Figure 5:
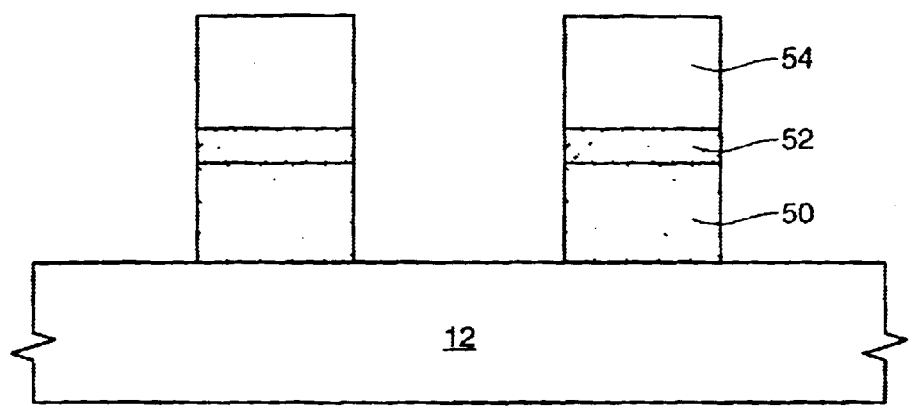
FIGS. 5–7 are cross sections depicting results from using low, medium, and high flow rates respectively of an oxygen-containing gas.
Figure 6:
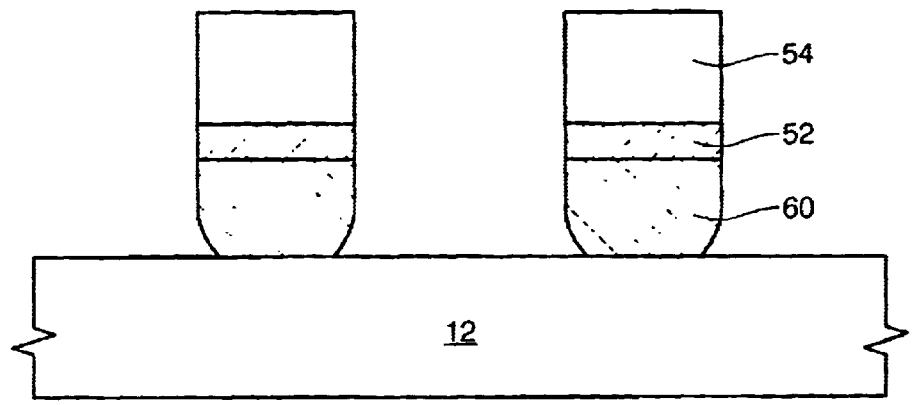
Figure 7:
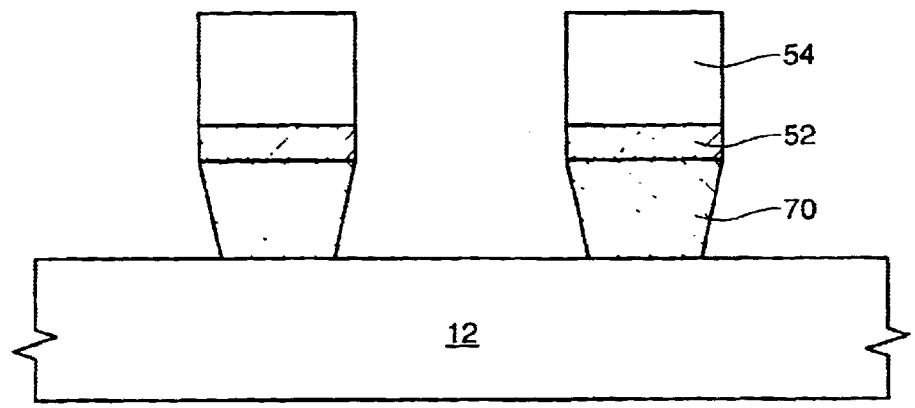

FIGS. 5–7 depict etch results on test wafers which can be expected with increasing flow rates of $HeO_2$. Similar results can be obtained with other oxygen-containing gasses. Each of FIGS. 5–7 comprise the use of a silicon wafer having blanket layers of polysilicon about 900 Å thick, a silicide layer about 1,000 Å thick overlying the polysilicon, a nitride layer about 1,500 Å thick overlying the silicide layer, and a patterned photoresist layer (not depicted) thereover. The photoresist is patterned to form features each having a width of 1,500 Å and a pitch of 3,000 Å. The nitride and silicide are both etched using conventional etches. For example, a nitride etch can comprise the use of 50 sccm $CF_4$, 50 sccm He, and 35 sccm CH$_2$F$_2$ at a pressure of 10 mTorr, an upper power of 700 watts, a lower power of 250 watts for a duration of 60 seconds. The silicide etch can comprise 75 sccm Cl$_2$ and 25 sccm CF$_4$ at a pressure of 4 mTorr, an upper power of 250 watts, a lower power of 75 watts for a duration of 50 seconds. Further, as the etch of the test wafers is performed to depict the change in isotropic etching which results from increasing the flow rate of the oxygen-containing gas, the polysilicon is first anisotropically etched to result in a vertical profile. An exemplary polysilicon etch comprises the use of 40 sccm Cl$_2$, 6 sccm HeO$_2$, and 180 sccm HBr at a pressure of 20 mTorr, an upper power of 160 watts, a lower power of 30 watts, for a duration of 30 seconds.

FIG. 5 depicts an etch using a flow rate of 6 sccm HeO$_2$, 50 sccm HBr, 100 sccm He, 70 watts lower power, 350 watts upper power, a pressure of 60 mTorr, and a duration of 60 seconds. The resulting etch provides little or no lateral etching or undercutting of the polysilicon 50, the silicide 52, or the nitride 54. This etch would, however, etch polysilicon in a vertical direction and would provide an inventive substitute for the exemplary polysilicon etch described in the previous paragraph. Thus the need for the 30% undercut tolerance described above is reduced or eliminated and a smaller device with increased feature density can be formed.

FIG. 6 depicts an etch using a flow rate of 9 sccm HeO$_2$, 50 sccm HBr, 100 sccm He, 70 watts lower power, 350 watts upper power, a pressure of 60 mTorr, and a duration of 60 seconds. The resulting etch undercuts the polysilicon 60, especially toward the bottom of the feature. The upper portion of the polysilicon 60 remains substantially vertical. This etch removes the polysilicon at a faster isotropic rate than the etch described with reference to FIG. 5.

FIG. 7 depicts an etch using a flow rate of 12 sccm HeO$_2$, 50 sccm HBr, 100 sccm He, 70 watts lower power, 350 watts upper power, a pressure of 60 mTorr, and a duration of 60 seconds. The resulting etch removes the polysilicon 60 along the entire height of the feature.

As is depicted in FIGS. 5–7, increasing the oxygen-containing etchant, for example the HeO$_2$ described, results in an increasingly retrograde etch profile. The etch profiles depicted in FIGS. 5–7 are generally homogeneous across a wafer with stacks at the edge of the wafer having etch rates and profiles similar to those at the center of the wafer or at any other wafer location. Also, the amount of undercut will increase with increased doping of the blanket polysilicon layer.

An embodiment of the etch can be used after a conventional etch, with the conventional etch removing the majority of exposed polysilicon, and the inventive etch used to remove any remaining undesirable polysilicon such as stringers from particularly small spaces.

A semiconductor assembly formed in accordance with the invention can be attached along with other devices to a printed circuit board, for example to a computer motherboard or as a part of a memory module used in a personal computer, a minicomputer, or a mainframe. A device formed in accordance with the invention could further be useful in other electronic devices related to telecommunications, the automobile industry, semiconductor test and manufacturing equipment, consumer electronics, and virtually any consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the various etch parameters can be easily modified by one of ordinary skill in the art for high density etchers other than the models described. It is therefore contemplated that the appended claims will cover any such modifications or embodiments as fall within the true scope of the invention.

What is claimed is:

1. A method used to form a semiconductor device, comprising:
   providing a semiconductor wafer substrate assembly having a planarized wafer surface and at least first and second features in spaced relation to each other which define a region comprising an opening between said first and second features;
   forming a conductive layer over said first and second features and within said opening;
   providing a patterned mask layer over said conductive layer, said patterned mask layer having an opening therein which exposes said region between said first and second features;
   etching said conductive layer within said opening between said first and second features using a continuous etch comprising:
      a first etch which erodes said conductive layer with ions traveling in a first direction substantially perpendicular with a plane of said planarized wafer surface and leaves conductive stringers between said first and second features subsequent to said first etch; then
      a second etch which electrically charges said ions to bend said charged ions into said stringers in a second direction which is less perpendicular with said plane of said planarized wafer surface than said first direction and removes said conductive stringers remaining between said first and second features.

2. A method used to form an electronic device having a semiconductor device, the semiconductor device formed by a method comprising:
   providing a semiconductor wafer substrate assembly having a planarized wafer surface and at least first and second features in spaced relation to each other which define a region comprising an opening between said first and second features;
   forming a conductive layer over said first and second features and within said opening;
   providing a patterned mask layer over said conductive layer, said patterned mask layer having an opening therein which exposes said region between said first and second features;
   etching said conductive layer within said opening between said first and second features using a continuous etch comprising:
      a first etch which erodes said conductive layer with ions traveling in a first direction substantially perpendicular with a plane of said planarized wafer surface and leaves conductive stringers between said first and second features subsequent to said first etch; then
      a second etch which electrically charges said ions to bend said charged ions into said stringers in a second direction which is less perpendicular with said plane of said planarized wafer surface than said first direction and removes said conductive stringers remaining between said first and second features.

3. The method of claim 2 further comprising:
   during said first etch:
      introducing an oxygen-containing gas into a chamber at an oxygen flow rate of between about 1.9 sccm and about 2.7 sccm;

introducing a halogen-containing gas into said etch chamber at a halogen flow rate of between about 35 sccm to about 65 sccm; and subjecting said semiconductor wafer substrate assembly to a top power of between about 245 watts to about 315 watts; and during said second etch:

increasing said flow rate of said oxygen-containing gas to an oxygen flow rate of between about 3.6 sccm to about 4.7 sccm;

maintaining said halogen-containing gas flow rate at a halogen flow rate of between about 35 sccm to about 65 sccm; and increasing said top power to between about 385 watts and about 455 watts.

4. The method of claim 1 further comprising forming a polysilicon layer during said formation of said conductive layer over said first and second features and within said opening.

5. The method of claim 4, further comprising:

during said etch of said conductive layer with said first etch, etching said polysilicon with an etch comprising a flow rate of between about 1.9 sccm and 2.7 sccm of an oxygen-containing gas, a flow rate of between about 35 sccm to about 65 sccm of a halogen-containing gas, and a top power of between about 245 watts and about 315 watts; and during said etch of said conductive layer with said second etch, etching said polysilicon with an etch comprising a flow rate of between about 3.6 sccm and about 4.7 sccm of an oxygen-containing gas, a flow rate of between about 35 sccm to about 65 sccm of a halogen-containing gas, and a top power of between about 385 watts to about 455 watts.

6. The method of claim 4, further comprising:

during said etch of said conductive layer with said first etch, etching said polysilicon with an etch comprising an oxygen flow rate of between about 1.9 sccm and 2.7 sccm, a flow rate of about 55 sccm of a halogen-containing gas, and a top power of between about 245 watts and about 315 watts; and during said etch of said conductive layer with said second etch, etching said polysilicon with an etch comprising an oxygen flow rate of between about 3.6 sccm and about 4.7 sccm, a flow rate of about 55 sccm of a halogen-containing gas, and a top power of between about 385 watts to about 455 watts.

7. The method of claim 2 further comprising forming a polysilicon layer during said formation of said conductive layer over said first and second features and within said opening.

8. The method of claim 7, further comprising:

during said etch of said conductive layer with said first etch, etching said polysilicon with an etch comprising a flow rate of between about 1.9 sccm and 2.7 sccm of an oxygen-containing gas, a flow rate of between about 35 sccm to about 65 sccm of a halogen-containing gas, and a top power of between about 245 watts and about 315 watts; and during said etch of said conductive layer with said second etch, etching said polysilicon with an etch comprising a flow rate of between about 3.6 sccm and about 4.7 sccm of an oxygen-containing gas, a flow rate of between about 35 sccm to about 65 sccm of a halogen-containing gas, and a top power of between about 385 watts to about 455 watts.

* * * * *